United States Patent
Roentgen et al.

(10) Patent No.: US 10,488,264 B2
(45) Date of Patent: Nov. 26, 2019

(54) DETERMINING SPECTRAL EMISSION CHARACTERISTICS OF INCIDENT RADIATION

(71) Applicant: AMS SENSORS SINGAPORE PTE. LTD., Singapore (SG)

(72) Inventors: Peter Roentgen, Thalwil (CH); Jens Geiger, Thalwil (CH); Markus Rossi, Jona (CH)

(73) Assignee: AMS SENSORS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/510,085

(22) PCT Filed: Sep. 8, 2015

(86) PCT No.: PCT/SG2015/050307
§ 371 (c)(1),
(2) Date: Mar. 9, 2017

(87) PCT Pub. No.: WO2016/039689
PCT Pub. Date: Mar. 17, 2016

(65) Prior Publication Data
US 2017/0248472 A1    Aug. 31, 2017

Related U.S. Application Data

(60) Provisional application No. 62/049,071, filed on Sep. 11, 2014.

(51) Int. Cl.
*G01J 9/00* (2006.01)
*G01J 1/42* (2006.01)
(Continued)

(52) U.S. Cl.
CPC ............... *G01J 9/00* (2013.01); *G01J 1/4257* (2013.01); *G01J 3/2803* (2013.01);
(Continued)

(58) Field of Classification Search
CPC .......... G01J 9/00; G01J 1/4257; G01J 3/2803; H01L 27/1443; H01L 27/1446;
(Continued)

(56) References Cited

U.S. PATENT DOCUMENTS

| | | | |
|---|---|---|---|
| 3,987,298 A | 10/1976 | Rotolante | |
| 4,309,604 A * | 1/1982 | Yoshikawa | G01J 1/44 250/226 |

(Continued)

FOREIGN PATENT DOCUMENTS

| | | |
|---|---|---|
| CN | 1379856 A | 11/2002 |
| DE | 3237071 A1 | 4/1984 |

OTHER PUBLICATIONS

International Search Report issued by ISA/AU dated Nov. 6, 2016 for PCT/SG2015/050307.
(Continued)

*Primary Examiner* — Hina F Ayub
(74) *Attorney, Agent, or Firm* — Michael Best & Friedrich LLP

(57) ABSTRACT

The present disclosure describes optical radiation sensors and detection techniques that facilitate assigning a specific wavelength to a measured photocurrent. The techniques can be used to determine the spectral emission characteristics of a radiation source. In one aspect, a method of determining spectral emission characteristics of incident radiation includes sensing at least some of the incident radiation using a light detector having first and second photosensitive regions whose optical responsivity characteristics differ from one another. The method further includes identifying a wavelength of the incident radiation based on a ratio of a photocurrent from the first region and a photocurrent from the second region.

10 Claims, 6 Drawing Sheets

(51) Int. Cl.
*G01J 3/28* (2006.01)
*H01L 27/144* (2006.01)
*H01L 31/0232* (2014.01)
*H01L 27/146* (2006.01)

(52) U.S. Cl.
CPC ...... *H01L 27/1443* (2013.01); *H01L 27/1446* (2013.01); *H01L 31/02327* (2013.01); *H01L 27/14621* (2013.01); *H01L 27/14647* (2013.01)

(58) Field of Classification Search
CPC ......... H01L 27/14621; H01L 27/14647; H01L 31/02327
USPC ........................................................ 356/416
See application file for complete search history.

(56) References Cited

U.S. PATENT DOCUMENTS

| | | | |
|---|---|---|---|
| 5,368,059 A * | 11/1994 | Box | B29B 7/7615 137/101.21 |
| 5,726,440 A | 3/1998 | Kalkhoran et al. | |
| 5,999,271 A * | 12/1999 | Shih | G01S 7/483 250/214 R |
| 6,081,331 A | 6/2000 | Teichmann | |
| 6,163,377 A | 12/2000 | Boles et al. | |
| 6,303,934 B1 | 10/2001 | Daly et al. | |
| 6,707,080 B2 | 3/2004 | Wang et al. | |
| 7,262,845 B2 | 8/2007 | Avrutsky | |
| 7,679,112 B2 | 3/2010 | Asaba | |
| 8,274,587 B2 * | 9/2012 | Hynecek | H01L 27/1461 257/291 |
| 8,686,479 B2 | 4/2014 | Hynecek | |
| 2002/0030818 A1 * | 3/2002 | Ruck | G01J 9/00 356/402 |
| 2004/0178465 A1 | 9/2004 | Merrill et al. | |
| 2005/0035272 A1 * | 2/2005 | Ono | G01J 3/02 250/208.2 |
| 2006/0231913 A1 | 10/2006 | Wilsey et al. | |
| 2009/0140718 A1 * | 6/2009 | Sochava | G01J 1/4257 324/71.5 |
| 2009/0303467 A1 | 12/2009 | Ashdown et al. | |
| 2009/0309529 A1 * | 12/2009 | Shoda | H02P 5/68 318/490 |
| 2012/0273910 A1 * | 11/2012 | Hochschulz | H01L 27/14629 257/432 |
| 2012/0318966 A1 | 12/2012 | Jensen et al. | |
| 2015/0129747 A1 * | 5/2015 | Petilli | H01L 27/14627 250/208.1 |
| 2016/0065925 A1 * | 3/2016 | Sawadaishi | H04N 9/646 348/242 |
| 2016/0187199 A1 * | 6/2016 | Brunk | G01J 3/2823 348/89 |

OTHER PUBLICATIONS

Feruglio, et al., "A Review of the CMOS Buried Double Junction (BDJ) Photodetector and its Applications," *Sensors* 2008, 8:6566-6594.

* cited by examiner

DETERMINING SPECTRAL EMISSION CHARACTERISTICS OF INCIDENT RADIATION

TECHNICAL FIELD

The present disclosure relates to measuring characteristics of optical radiation.

BACKGROUND

Various manufacturing and other processes involve measuring and collecting optical radiation data, in particular spectral emission characteristics, of a source of optical radiation. The manufacturing or other process may be a process for which optical radiation is used as part of performing the process or in which optical radiation is generated by the process. In some instances, such as imaging applications, it may be desirable to measure and determine the spectral emission characteristics of the ambient light.

While various techniques are available, some known techniques provide only global or averaged measurements for a region of the process. For example, an array of photodiodes can be provided to measure incident light of various wavelengths. The response of the photodiodes, however, generally depends on the intensity of the incident radiation as well as on the wavelength of the radiation. As a result, it may not be possible to assign a particular photocurrent value to a unique wavelength. For example, if ambient light is being detected, it may not be possible to correlate a particular value of photocurrent with a specific wavelength of specific part of the spectrum.

Further, some light sources have multiple emission peaks. For example, sodium vapor lamps generate two emission peaks near 589 nm Those peaks, however, are outside typical red (R), blue (B) and green (G) filters. Thus, a sensor configured only with these filters will be unable to detect the sodium-vapor lines.

SUMMARY

The present disclosure describes optical radiation sensors and detection techniques that facilitate assigning a specific wavelength to a measured photocurrent. The techniques can be used to determine the spectral emission characteristics of a radiation source.

For example, in one aspect, a method of determining spectral emission characteristics of incident radiation includes sensing at least some of the incident radiation using a light detector having first and second photosensitive regions whose optical responsivity characteristics differ from one another. The method further includes identifying a wavelength of the incident radiation based on a ratio of a photocurrent from the first region and a photocurrent from the second region.

Some implementations include one or more of the following features. For example, in some cases, incident radiation sensed by the light detector passes through an optical filter before being sensed by the light detector. In some instances, the first and second regions of the light detector are arranged as stacked photodiodes. The method can include sensing at least some of the incident radiation using a plurality of light detectors, each of which has respective first and second photosensitive regions wherein an optical responsivity characteristics of the first region differs from an optical responsivity characteristics of the second region, and wherein each light detector is configured to sense a different respective part of the optical spectrum. The method may further include identifying one or more wavelengths of the incident radiation, wherein each wavelength is identified based on a ratio of a photocurrent from a first one of the photosensitive regions and a photocurrent from the second photosensitive region in the same light detector as the first region. In some implementations, incident radiation sensed by each particular light detector passes through a respective optical filter before being sensed by the particular light detector, wherein each optical filter passes a respective wavelength or band of wavelengths that differs from at least some of the other optical filters. In some cases, the method can include comparing the ratio of photocurrents to values stored in a look-up table, and assigning a wavelength associated with a closest matched value in the look-up table to the incident radiation. The method may include controlling a component of a host device based on an identification of the wavelength of the incident radiation.

In another aspect, a system for determining spectral emission characteristics of incident radiation includes a light detector including first and second photosensitive regions whose optical responsivity characteristics differ from one another. The system also includes processing circuitry coupled to the light detector and configured to receive respective photocurrents from the first and second photosensitive regions, to calculate a ratio of the photocurrents from the first and second photosensitive regions, and to assign a wavelength to the incident light based on the ratio of the photocurrents.

In some implementations, the system includes one or more of the following features. For example, the light detector can include a stacked photodiode structure. The system can include an optical filter that limits wavelengths of light incident on the photosensitive regions of the light detector. The optical filter may allow only a single wavelength or a narrow wavelength band to pass through. In some instances, the system includes a plurality of light detectors, each of which includes respective first and second photosensitive regions, wherein optical responsivity characteristics of the first photosensitive region differ from optical responsivity characteristics of the second photosensitive region. Each light detector can have a respective optical filter that allows the light detector to sense a wavelength or narrow wavelength band different from the other light detectors. The processing circuitry can be configured to identify one or more wavelengths of the incident radiation, wherein each wavelength is identified based on a ratio of a photocurrent from a first one of the photosensitive regions and a photocurrent from the second photosensitive region of the same light detector as the first photosensitive region.

In a further aspect, a system for determining spectral emission characteristics of incident light includes an array of light sensitive elements composed at least in part of stacked first and second photosensitive regions whose optical responsivity characteristics differ from one another. Optical filters are disposed over the array of light sensitive elements, wherein the optical filters are configured to allow only respective narrow parts of the optical spectrum to pass to different ones of the light sensitive elements such that different ones of the light sensitive elements or sub-groups of the light sensitive elements are operable to sense light in a part of the optical spectrum that differs from other ones of the light sensitive elements or sub-groups of the light sensitive elements. Processing circuitry coupled to the light sensitive elements and configured to receive respective photocurrents from the first and second photosensitive regions for each light sensitive element, to calculate respective ratios of the photocurrents from the first and second photosensitive regions for at least some of the light sensitive elements, and to assign respective wavelengths to the incident light based on the calculated ratios.

In some implementations of the system, the optical filters form a continuous or semi-continuous spectrum of optical filters. The optical filters, in some instances, collectively allow substantially the entire visible portion of the optical spectrum to be sensed by the array of light sensitive elements at a resolution in a range of 2 nm-4 nm The array of light sensitive elements can be, for example, a CMOS sensor.

The present disclosure can be used for a wide range of applications that involve measuring the spectral emission characteristics of optical radiation.

Other aspects, features and advantages will be readily apparent from the following detailed description, the accompanying drawings, and the claim.

DETAILED DESCRIPTION

Figure 1:
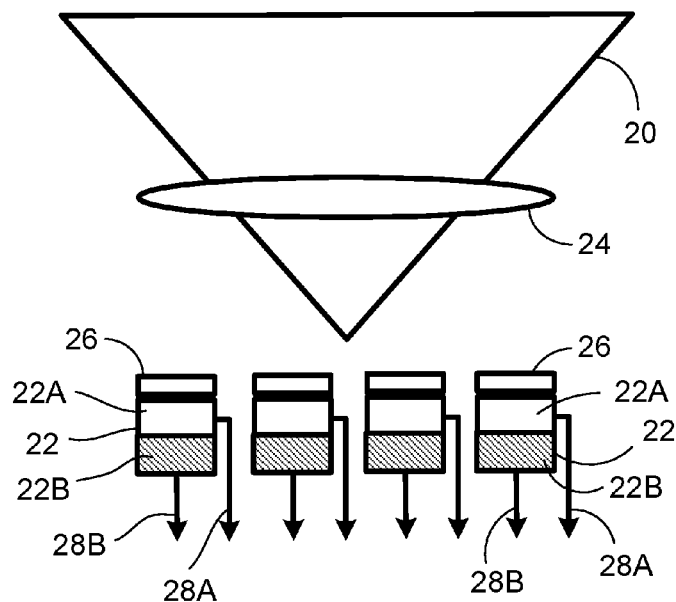
FIG. 1 illustrates an arrangement for detecting monochromatic incident light.

As illustrated in FIG. 1, optical radiation 20 is incident on light detectors 22, each of which has multiple spectral sensitivity. In particular, each light detector 22 can be implemented, for example, as stacked semiconductor (e.g., silicon) photodiodes 22A, 22B. The stacked photodiode structure has multiple (e.g., two) junctions whose optical responsivities (i.e., spectral characteristics) differ from one another. In this example, it is assumed that the incident light 20 is substantially monochromatic (e.g., having a single wavelength or a very narrow spectrum about a center peak wavelength). As shown in FIG. 1, a wide field-of-view (FOY) or other optical system 24 including one or more beam shaping elements such as lenses can focus the incident radiation 20 onto the light detectors 22. In some cases, an optical filter 26 is provided over each light detector 22. For example, the optical filters 26 may be clear so as to allow only visible light to pass through for detection by the light detectors 22. Outputs 28A, 28B from the light detectors 22 can be provided to processing circuitry configured to process the photocurrents and assign a corresponding wavelength to the incident light 20 based on the photocurrents.

Figure 2:
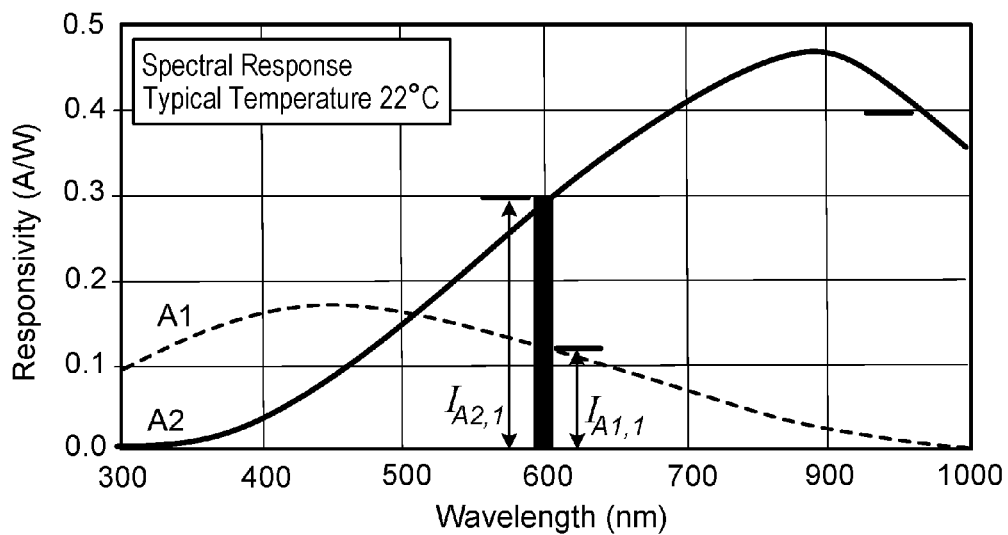
FIG. 2 is an example of optical responsivity curves.

FIG. 2 illustrates an example of two curves A1, A2, each of which represents the optical responsivity of one of the photodiodes 22A, 22B versus wavelength. In the illustrated example, curve A1 represents the optical responsivity of a particular junction 22A in one of the light detectors 22, and curve A2 represents the optical responsivity of the other junction 22B in the same light detector 22. Optical responsivity (also referred to as photoresponsivity) generally is a function of the wavelength of the incident light. As is apparent from the illustrated example, the two curves A1 and A2 differ from one another. Thus, assuming the wavelength of the incident light is about 600 nm, the responsivity for junction 22A (using curve A1) will be detected as $I_{A1,1}$, whereas the responsivity for junction 22B (using curve A2) will be detected as $I_{A2,1}$.

Figure 3:
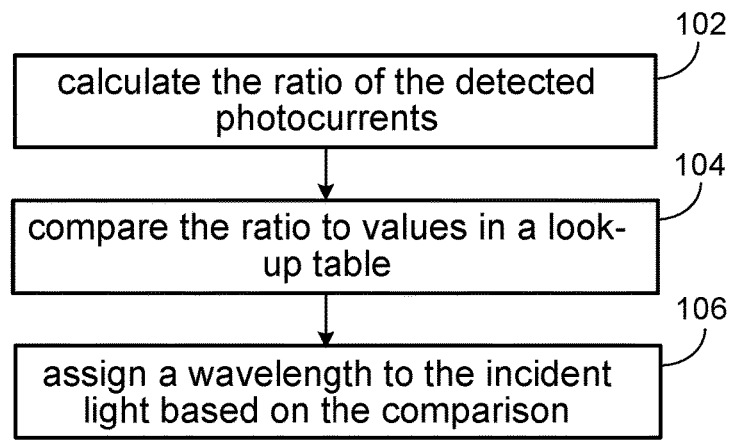
FIG. 3 is a flow chart showing a method of determining the wavelength(s) of incident light.

The processing circuitry is operable to calculate the ratio of the photocurrents (i.e., optical responsivities) $I_{A1,1}/I_{A2,1}$ (102 in FIG. 3). Assuming that the incident light is substantially monochromatic, the ratio of the photocurrents will be substantially the same for a given wavelength of incident light, regardless of the intensity of the incident light. Thus, the ratio of the photocurrents can be compared, for example, to ratio values in a look-up table stored in memory associated with the processing circuitry (104) and, based on the comparison, the processing circuitry can assign a wavelength to the incident light (106). In particular, the processing circuitry assigns the wavelength that is associated with the closest match to the calculated ratio. The values stored in the look-up table may be determined experimentally. In some cases, instead of comparing the calculated ratio to values in a look-up table, the processing circuitry can determine the corresponding wavelength of the incident light using a predetermined equation.

Figure 4:
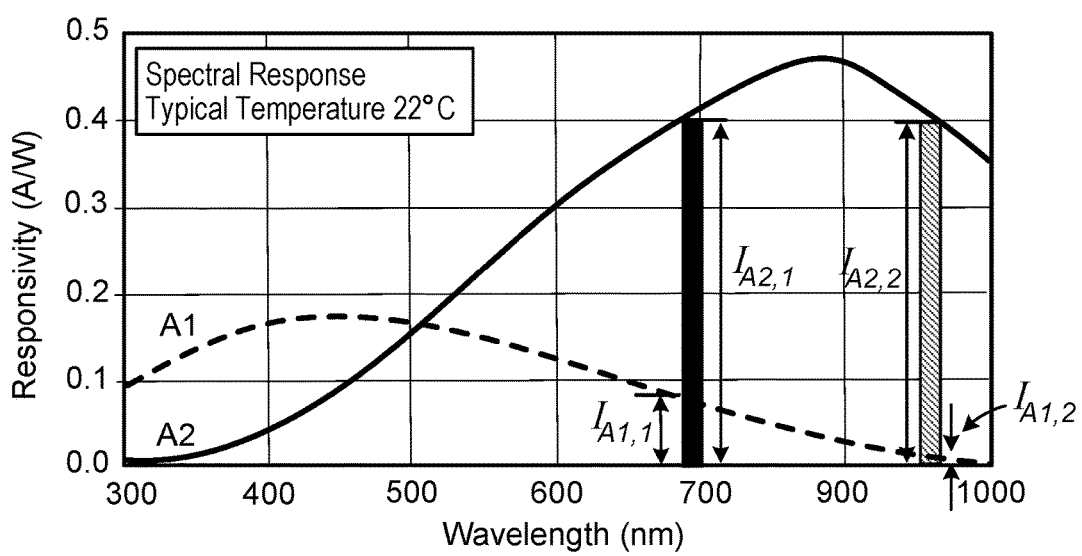
FIG. 4 is another example of optical responsivity curves.

An advantage of using the ratio of the detected photocurrents to assign a wavelength to the incident light can be appreciated from the example of FIG. 4, which shows the same two responsivity curves A1, A2 as FIG. 2. As indicated by the values $I_{A2,1}$ and $I_{A2,2}$ in FIG. 4, the second junction 22B of one of the light detectors 22 generates the same photocurrent at two different wavelengths (i.e., 700 nm and 970 nm). The first junction 22A, however, generates a different photocurrent for incident light at those same wavelengths. Thus, for incident light having a wavelength of 700 nm, the first junction 22A generates a photocurrent $I_{A1,1}$, whereas for incident light having a wavelength of 970 nm, the first junction 22A generates a smaller photocurrent $I_{A1,2}$. Here too, the processing circuitry can calculate the ratio of the actual photocurrents and, based on the ratio, can assign a wavelength to the incident light. As in the example of FIG. 2, it is assumed in the example of FIG. 4 that the incident light is substantially monochromatic.

Figure 5:
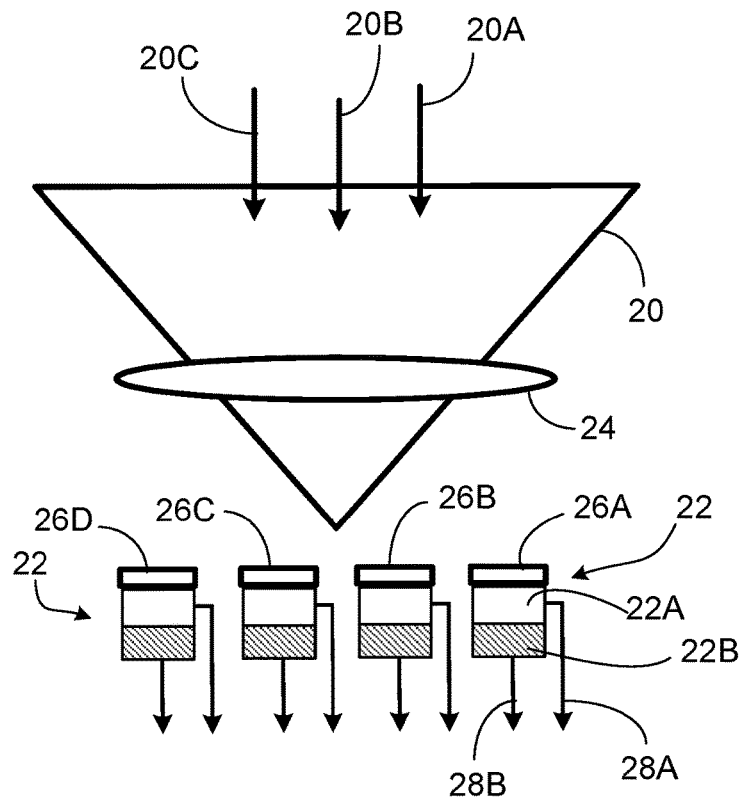
FIG. 5 illustrates an arrangement for detecting non-monochromatic incident light.

In some implementations, even if the incident light is non-monochromatic and consists of multiple narrow bands in different parts of the spectrum, it is possible to determine the wavelengths of the incident light with reasonable accuracy by providing narrow band pass filters. FIG. 5 illustrates an example in which it is assumed that the incident light 20 consists of discrete wavelengths in three different narrow bands 20A, 20B, 20C (e.g., red, green and blue). Each of the light detectors 22 can be similar to those described with respect to FIG. 1. In addition, some of the light detectors 22 have a respective optical filter 26A-26C that allows light of only a single part of the spectrum to pass through to the underlying stacked photodiodes 22A, 22B. For example, as shown in FIG. 5, one of the light detectors 22 has a filter 26A that allows only red light in the visible part of the spectrum to pass, another light detector 22 has a filter 26B that allows only green light to pass, and a third light detector 22 has a filter 26C that allows only blue light in the visible part of the spectrum to pass.

Some light sources are monochromatic. For example, a sodium vapor lamp may emit light only at 589 nm If the emitted wavelength (or narrow band of wavelengths) is outside the ranges of wavelengths passed by the filters 26A-26C, then the emitted light will not be detected by any of the light detectors 22 having those filters. To address such situations, an additional light detector 22 can be provided, for example, with a clear filter 26D that allows visible light of all colors to pass. Assuming that the incident (visible) light is monochromatic, the processing circuitry can determine the wavelength of the light in the manner described above by using the ratio of the photocurrent outputs from the light detector having the clear filter.

In the foregoing example, it is assumed that the clear filter allows only visible light to pass. In other cases, the clear filter may also allow light in other parts of the spectrum (e.g., IR, near-IR or UV) to pass.

Figure 6A:
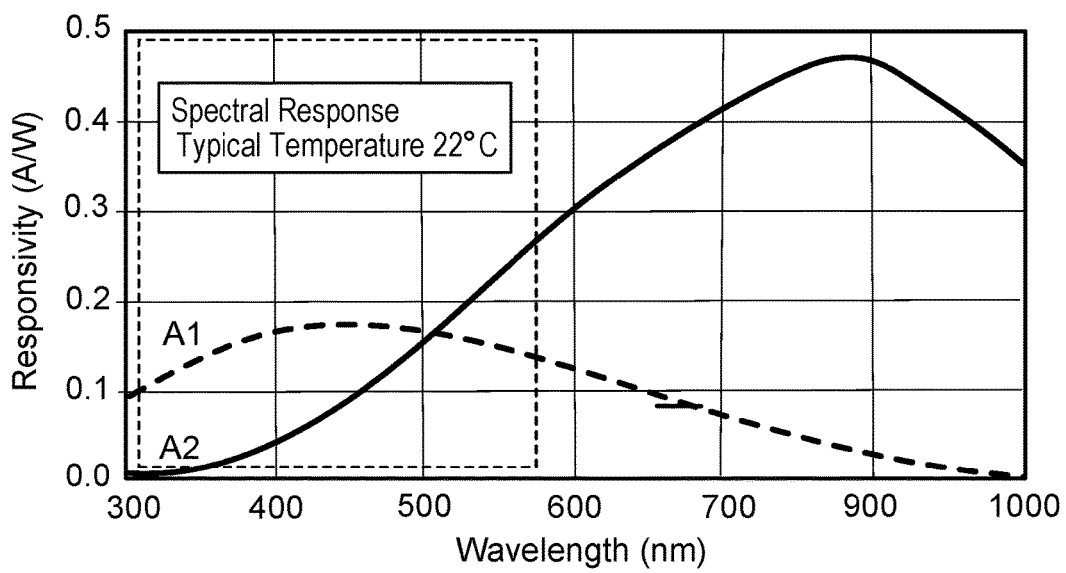
FIGS. 6A, 6B and 6C are further examples of optical responsivity curves.
Figure 6B:
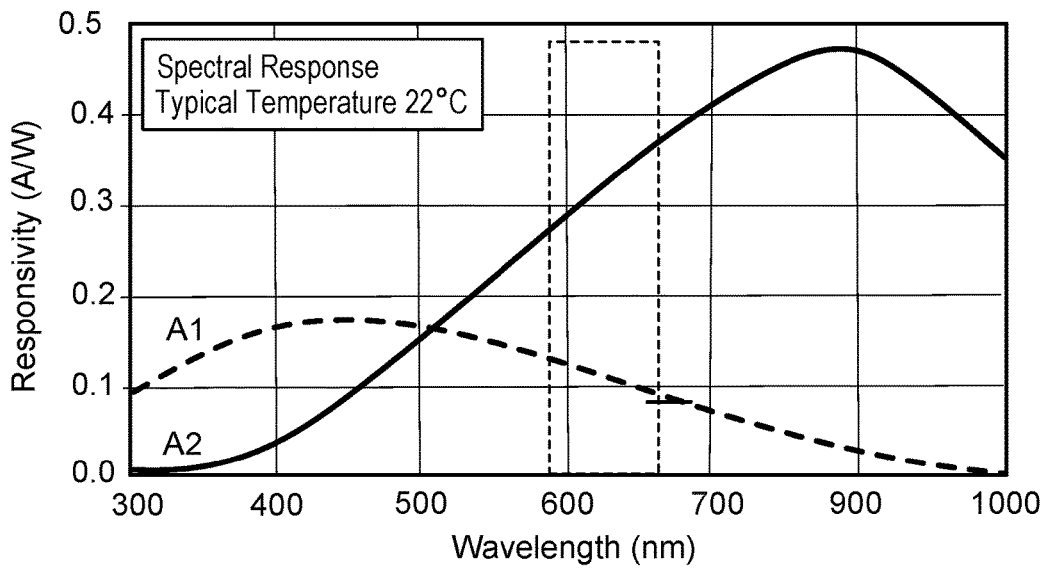
Figure 6C:
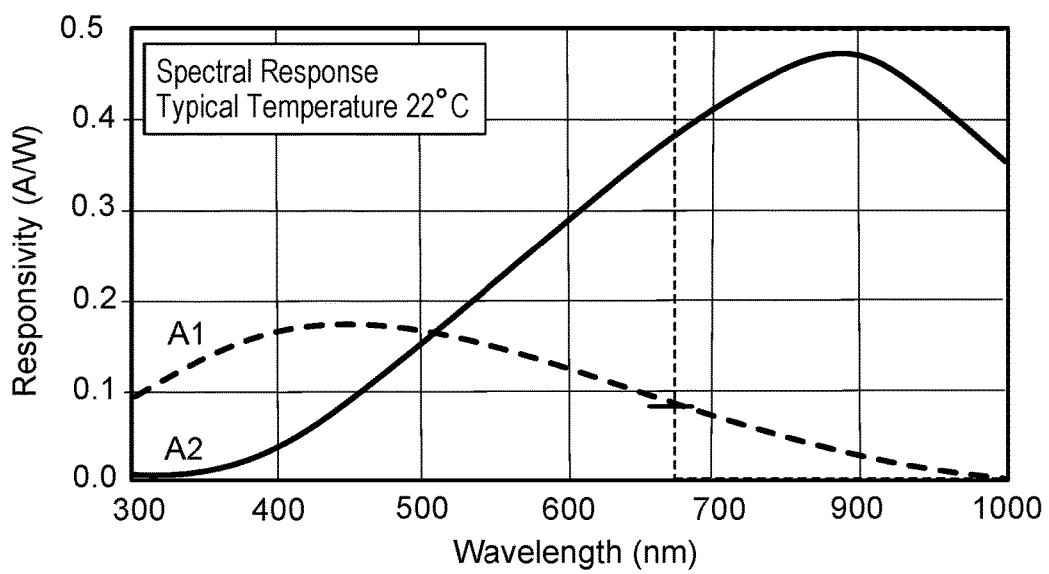

Each light detector 22 thus can detect only light within a specified narrow band (see FIGS. 6A, 6B and 6C in which the dashed lines indicate, respectively, the blue, green and red parts of the visible spectrum that can be detected by the individual detectors 22. Thus, FIG. 6A indicates the blue part of visible spectrum detectable by the detector 22 having the blue band pass filter 26C, FIG. 6B indicates the green part of visible spectrum detectable by the detector 22 having the green band pass filter 26B, and FIG. 6C indicates the red part of visible spectrum detectable by the detector 22 having the red band pass filter 26A. Each pair of photocurrent outputs 28A, 28B from a given one of the detectors 22 can be used by the processing circuitry to determine a ratio and to assign a wavelength to the incident light within that part of the spectrum, as described above in connection with FIGS. 2-4.

In some instances, instead of assigning a calculated photocurrent ratio to a particular wavelength, the processing circuitry may simply determine whether the calculated ratio is within a specified tolerance of a predetermined ratio. If the calculated ratio is outside the specified tolerance, the processing circuitry can cause an alarm or message to be generated to indicate that the incident light differs from the expected wavelength.

Although the filters in the particular example of FIG. 5 are designed to pass red, green and blue light, respectively, in other cases, filters designed to pass different parts of the spectrum may be provided (e.g., infra-red or ultra-violet). Further, a different number of light detectors, each corresponding to a respective wavelength band, may be provided. In general, as long as each wavelength (or narrow band) in the incident light falls within one of the defined regions of the optical spectrum, the processing circuitry can determine the wavelengths of the incident light.

Figure 7:
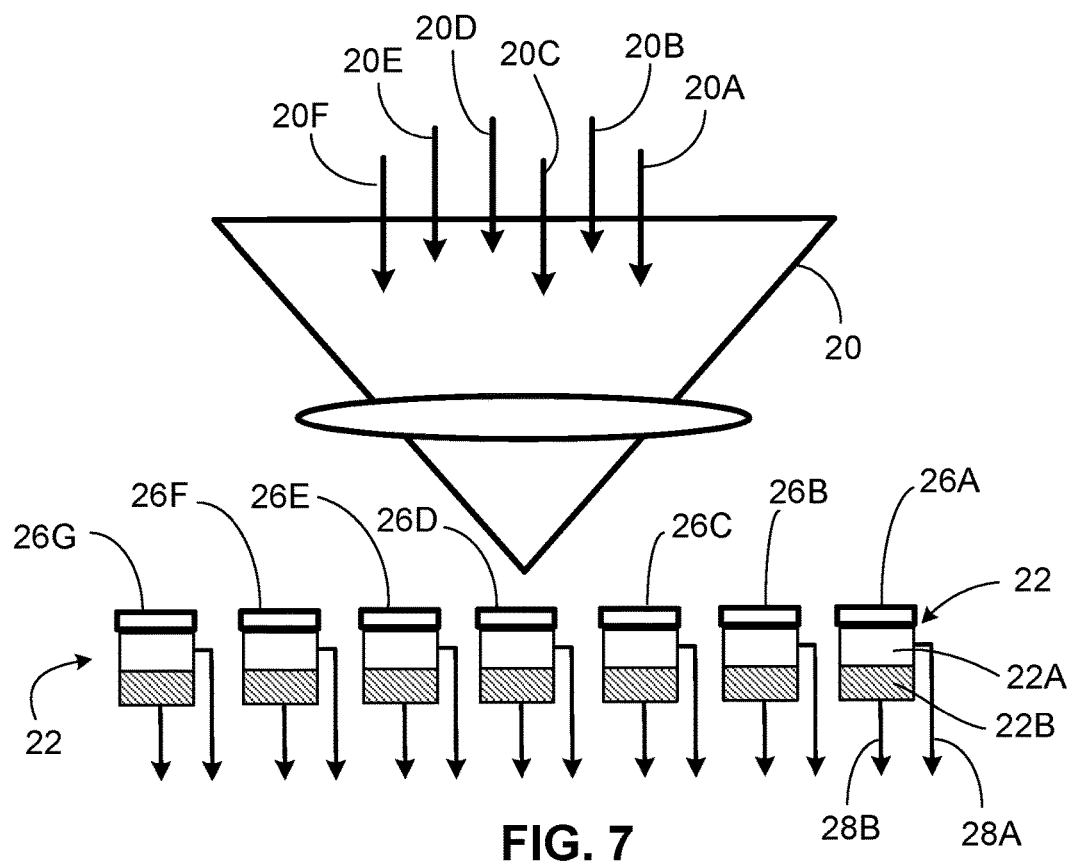
FIG. 7 illustrates another arrangement for detecting non-monochromatic light.

Thus, the number of photodiodes 22 and associated filters 26 for different spectral regions can be increased so that even greater numbers of wavelengths can be identified from a multi-band light source. FIG. 7 illustrates an example that includes seven light detectors 22. Six of the light detectors 22 have a respective optical filter (26A, 26B, 26C, 26E, 26F, 26G) that allows a different respective spectral region to pass. Thus, the individual wavelengths of incident light including up to six discrete wavelengths or narrow wavelength bands 20A-20F can be identified as long as each wavelength or narrow band falls within a different one of the non-overlapping wavelength regions encompassed by a respective one of the light detectors 22 as defined by the color filters. As described above, each light detector 22 can include a stacked photodiode structure having junctions whose optical responsivities differ from one another. The processing circuitry can calculate the ratio of the photocurrent outputs 28A, 28B from each particular light detector 22 and, using the ratios, can identify the wavelengths of the incident light. In some cases, another one of the light detectors 22 includes a clear filter 26D that allows visible light of all colors to pass. The foregoing arrangement can be expanded to identify the wavelengths of other multi-band light sources by increasing the number of light detectors 22 and providing each light detector with an optical filter that allows only a different wavelength or narrow wavelength band to pass.

In some instances, even if some (or all) of the wavelength bands of the incident light are somewhat wide (i.e., covering more than a single wavelength), the ratio of the optical responses from a particular photodiode can be used to identify the approximate value of the wavelength(s) in a corresponding band. Thus, although in some cases it may not be possible to identify the precise wavelengths of broadband incident light, the processing circuitry can use the ratios of the photocurrent outputs 28A, 28B from each particular light detector to identify the approximate position within each color-filter range so as to determine the approximate wavelengths of the incident light.

Figure 8:
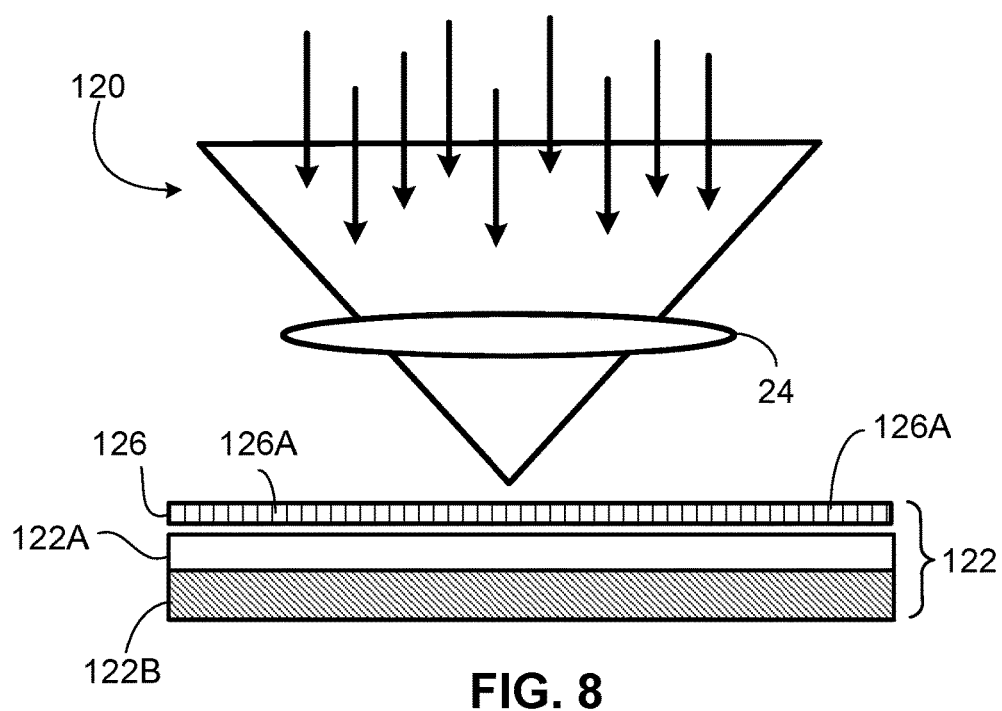
FIG. 8 is an example of an arrangement for detecting broadband or full-spectrum incident light.

In the foregoing implementations, the light detectors 22 are discrete devices each of which has multiple spectral sensitivity (e.g., a stacked photodiode structure having multiple junctions whose optical responsivity curves differ from one another). FIG. 8 illustrates another implementation that can be particularly useful for determining the wavelengths of multi-band or full-spectrum incident light 120. In this implementation, instead of multiple discrete devices for the light detectors 22, an array 122 of light sensitive elements (e.g., a CMOS sensor) can be provided. The pixel array 122 includes multiple (e.g., two) vertically stacked photodiodes organized in a two-dimensional grid and having junctions 122A, 122B whose optical responsivity curves differ from one another. A continuous or semi-continuous spectrum of optical filters 126 can be provided over the pixel array 122. Each filter 126A can be configured to allow only a narrow part of the optical spectrum to pass. The number of filters 126A can be made sufficiently large such that, collectively, the filters allow a wide range of narrow wavelength bands to pass to the underlying pixels. The filters 126A are arranged, however, such that each pixel (or sub-group of pixels) receives light within only a narrow wavelength band. In a particular implementation, the CMOS sensor pixel array may have dimensions of 100×100 pixels and can cover substantially the entire visible spectral range from 400 nm-700 nm with resolution in the range of 2 nm-4 nm.

Figure 9:
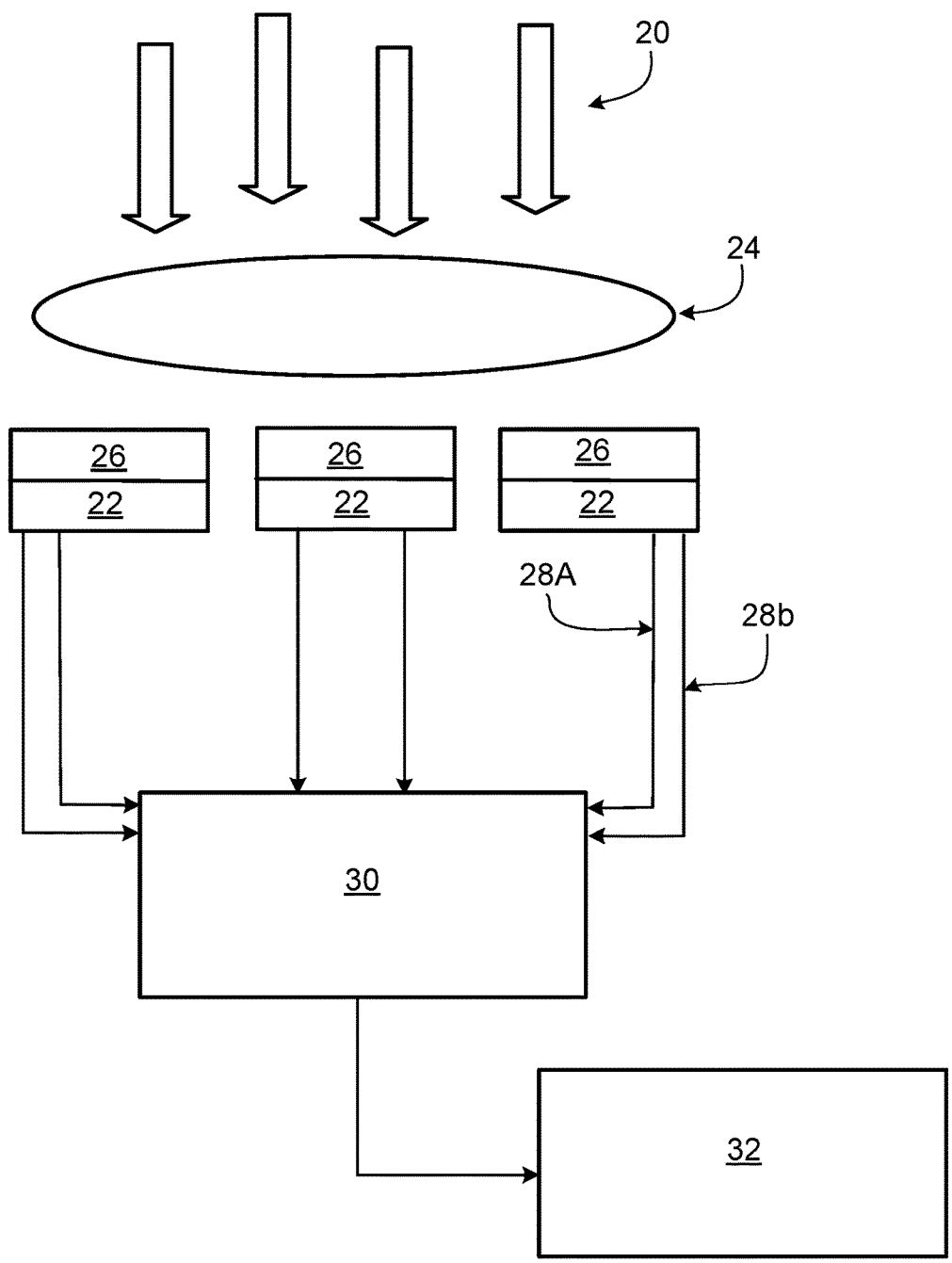
FIG. 9 is a block diagram of a system for detecting incident light and determining the wavelength(s) of the incident light.

As shown in FIG. 9, a system for detecting incident light and determining the wavelength(s) of the incident light can include processing circuitry 30. The processing circuitry 30 to operable to read signals from the light detectors 22 (or 122) and to process the signals so as to identify one or more wavelengths in the incident light in accordance with the techniques described above. The processing circuitry 30 can be implemented, for example, as one or more integrated circuits in one or more semiconductor chips with appropriate digital logic and/or other hardware components (e.g., read-out registers; amplifiers; analog-to-digital converters; clock drivers; timing logic; signal processing circuitry; and/or microprocessor). The processing circuitry 30 is, thus, configured to implement the various functions associated with such circuitry.

The foregoing techniques may be applicable in a wide range of applications, including semiconductor processing where monitoring of spectral emission characteristics of the ambient environment may be required or tuning of a radiation source may be needed. The techniques also may be useful in spectrometry application. Further, the techniques also can be advantageous in imaging applications, where it may be desirable to measure and determine the spectral emission characteristics of the ambient light.

The optics assembly and light detectors 22 (or 122) can be incorporated into a compact module having a relatively small footprint. The module, in turn, can be integrated into a host device (e.g., a smart phone or other handheld computing device) that includes, for example, a camera. The photocurrent outputs from the light detectors 22 (or 122) can be provided to processing circuitry 30 residing in the host device. Further, in some cases, an output from the processing circuitry 30 can be provided to other components 32 of the host device (e.g., a camera or a display screen) to indicate ambient light information. The camera may use such information, for example, to adjust the camera aperture or to adjust the brightness of the display screen.

Various modifications can be made within the spirit of the foregoing disclosure. Thus, other implementations are within the scope of the claims.

What is claimed is:

1. A method of determining spectral emission characteristics of incident radiation, the method comprising:
   sensing at least some of the incident radiation using a light detector having a stacked photodiode structure that includes first and second photosensitive regions, wherein optical responsivity characteristics of the first and second photosensitive regions differ from one another, and wherein the incident radiation sensed by the light detector passes through an optical filter before being sensed by the light detector;
   calculating a ratio of a photocurrent from the first region and a photocurrent from the second region; and
   determining whether the calculated ratio is within a specified tolerance of a predetermined ratio, and, in response to the calculated ratio being outside the specified tolerance, causing an alarm or message to be generated to indicate that the incident radiation has a wavelength that differs from an expected wavelength.

2. The method of claim 1 including:
   sensing at least some of the incident radiation using a plurality of light detectors, each of which has a stacked photodiode structure including respective first and second photosensitive regions wherein an optical responsivity characteristic of the first region differs from an optical responsivity characteristic of the second region, and wherein each light detector has a respective optical filter associated therewith such that the light detector is configured to sense a respective part of the optical spectrum different than other ones of the light detectors; and
   identifying one or more wavelengths of the incident radiation, wherein each wavelength is identified based on a ratio of a photocurrent from a first one of the photosensitive regions and a photocurrent from the second photosensitive region in the same light detector as the first region.

3. The method of claim 2 wherein incident radiation sensed by each particular light detector passes through the respective optical filter before being sensed by the particular light detector, wherein each optical filter passes a respective wavelength or band of wavelengths that differs from at least some of the other optical filters.

4. The method of claim 1 including:
   comparing the ratio of photocurrents to values stored in a look-up table; and
   assigning a wavelength associated with a closest matched value in the look-up table to the incident radiation.

5. The method of claim 4 further including controlling a component of a host device based on the wavelength assigned to the incident radiation.

6. The method of claim 5 wherein the component is a display of handheld computing device.

7. The method of claim 6 wherein the handheld computing device is a smartphone.

8. A system for determining spectral emission characteristics of incident radiation, the system comprising:
   a light detector having a stacked photodiode structure including first and second photosensitive regions whose optical responsivity characteristics differ from one another;
   an optical filter that limits wavelengths of light incident on the photosensitive regions of the light detector;
   processing circuitry coupled to the light detector and configured to receive respective photocurrents from the first and second photosensitive regions, to calculate a ratio of the photocurrents from the first and second photosensitive regions, to determine whether the calculated ratio is within a specified tolerance of a predetermined ratio, and, in response to the calculated ratio being outside the specified tolerance, to cause an alarm or message to be generated to indicate that the incident radiation has a wavelength that differs from an expected wavelength.

9. The system of claim 8 wherein the optical filter allows only a single wavelength or a narrow wavelength band to pass through.

10. The system of claim 8 including a plurality of light detectors, each of which has a stacked photodiode structure that includes respective first and second photosensitive regions, wherein optical responsivity characteristics of the first photosensitive region differ from optical responsivity characteristics of the second photosensitive region,
   wherein each light detector has a respective optical filter that allows the light detector to sense a wavelength or narrow wavelength band different from the other light detectors, and
   wherein the processing circuitry is configured to identify one or more wavelengths of the incident radiation, wherein each wavelength is identified based on a ratio of a photocurrent from a first one of the photosensitive regions and a photocurrent from the second photosensitive region of the same light detector as the first photosensitive region.

* * * * *